United States Patent [19]
Shibuya et al.

[11] Patent Number: 5,614,271
[45] Date of Patent: Mar. 25, 1997

[54] METHOD FOR THE FORMATION OF A SILICA-BASED COATING FILM

[75] Inventors: Tatsuhiko Shibuya, Kanagawa-ken; Susumu Okano, Matsuyama; Hideya Kobari, Yokohama; Yoshio Hagiwara, Tokyo-to; Toshimasa Nakayama, Chigasaki, all of Japan

[73] Assignee: Tokyo Ohka Kogyo Co., Ltd., Japan

[21] Appl. No.: 692,187

[22] Filed: Aug. 5, 1996

[30] Foreign Application Priority Data

Aug. 11, 1995 [JP] Japan ................... 7-205877

[51] Int. Cl.$^6$ ................... B29C 71/02
[52] U.S. Cl. ............ 427/541; 427/379; 427/387; 427/558; 427/559; 427/595
[58] Field of Search ................... 427/541, 558, 427/559, 595, 379, 387

[56] References Cited

U.S. PATENT DOCUMENTS 4,865,649  9/1989  Kashiwagi et al. ........... 106/287.16

FOREIGN PATENT DOCUMENTS

| 0559394 | 9/1993 | European Pat. Off. |
| 5-105486 | 4/1993 | Japan |
| 5-119307 | 5/1993 | Japan |
| 5-121572 | 5/1993 | Japan |

*Primary Examiner*—Bernard Pianalto
*Attorney, Agent, or Firm*—Wenderoth, Lind & Ponack

[57] ABSTRACT

Proposed is an improved method for the formation of a silica-based coating film on the surface of a substrate such as a silicon wafer in the manufacture of semiconductor devices by coating the substrate surface with a polysilazane-containing coating solution followed by conversion of the coating layer of polysilazane into a silica-based coating film. The method comprises drying the coating layer of the polysilazane according to a heating schedule at a specified heating rate with continuous or stepwise increase of the temperature up to 240° to 350° C. followed by an irradiation treatment with far ultraviolet light at a temperature of 240° to 350° C. and then by a baking treatment at 350° to 800° C.

6 Claims, 1 Drawing Sheet

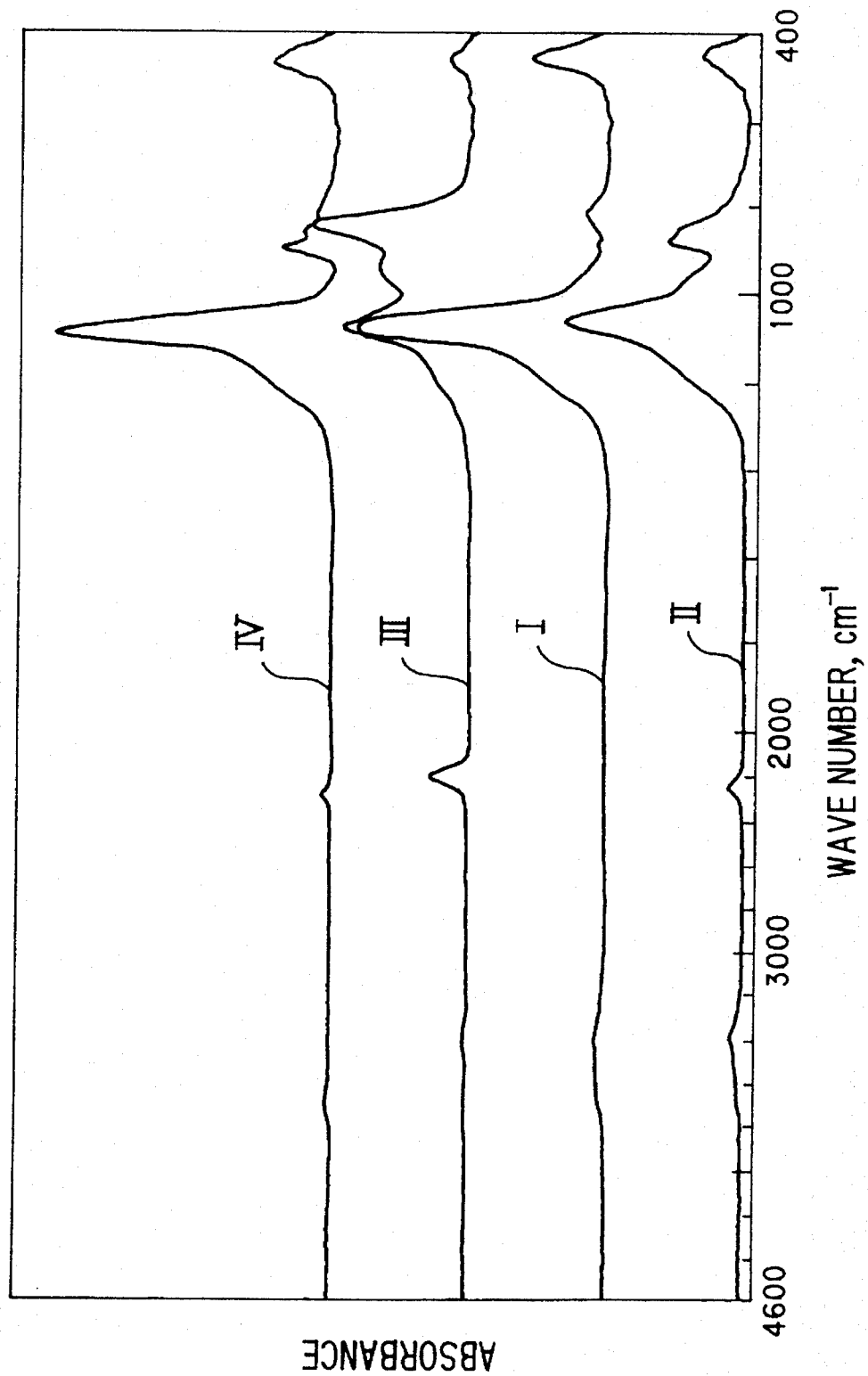

METHOD FOR THE FORMATION OF A SILICA-BASED COATING FILM

BACKGROUND OF THE INVENTION

The present invention relates to an improvement in a method for the formation of a silica-based coating film on the surface of a substrate. More particularly, the invention relates to an improvement in the method for the formation, on the surface of a substrate, of a silica-based coating film having a relatively large thickness and high uniformity as well as denseness and capable of exhibiting excellent adhesion to the substrate surface and resistance against crack formation so as to be useful, for example, as an interlayer insulating film, planarizing film, intermediate film, phase-shifter material, protective film, orientation film and the like in the manufacture of semiconductor devices and liquid crystal display devices.

In the manufacturing processes of semiconductor devices, liquid crystal display devices and the like in the prior art, in which planarizing films, interlayer insulating films, protective films, orientation films, intermediate films in a multi-layered resist and phase-shifter materials are used, the most widely used material for the films is silica. As a method for the formation of such a silica-based coating film on the substrate surface, the vapor-phase growing method and wet-process coating method are usually undertaken.

The former method of the vapor-phase growing, which is a method in which silica is deposited from the vapor phase on the surface of a substrate by using a special apparatus, is disadvantageous in respect of the use of a very expensive apparatus and a relatively low productivity of the process in the industrial manufacture of semiconductor devices and liquid crystal display devices.

On the other hand, the latter method of wet-process coating, in which a substrate surface is coated with a coating solution in an organic solvent containing a hydrolyzate of an alkoxy silane compound followed by a baking treatment to convert the hydrolyzate of the silane compound into silica, is advantageous and widely employed in the electronics industry because no expensive apparatus is required and the productivity of the process is considerably high.

One of the typical coating compositions or coating solutions for the formation of a silica-based coating film used in the above mentioned coating method is prepared by dissolving, for example, a tetraalkoxy silane compound or a monoalkyl trialkoxy silane compound having a lower alkyl group in the molecule in an organic solvent which is mainly an alcohol to effect hydrolysis of the silane compound in the solution (see Japanese Patent Kokai 63-241076). The coating solutions of this type are fully suitable for the manufacture of semiconductor devices of a high degree of integration such as the 4-mega DRAMs and 16-mega DRAMs prepared by fine patterning of sub-micron order of fineness with a line width of about 0.8 µm or half-micron order of fineness with a line width of about 0.5 µm as the major current heretofore. Along with the recent trend toward higher and higher degree of integration for 64-mega DRAMs and 1-giga DRAMs in the technology of semiconductor devices, a still finer patterning with a line width of 0.35 µm or smaller is required, for which the above described coating solutions can no longer meet the requirements in recent years.

Taking the case of formation of a planarizing film for ultrafine patterning by using the above mentioned coating solution as an example, several detrimental phenomena are caused by the remaining gases produced in the course of drying and heat treatment of the hydrolyzate of the alkoxy silane compound, such as methane and the like as the decomposition products of the alkyl groups in the alkoxy silane compound and water vapor, resulting in a decrease in the adhesive bonding strength of the upper coating layer to the planarizing film or corrosion of the metallic wiring layer. When the planarizing treatment involves a step of etch-back, the thickness of the silica-based coating film on the interlayer insulating film is large in the densely patterned areas and small in the sparsely patterned areas with a great difference in the film thickness between the densely and sparsely patterned areas. This phenomenon results in a trouble that, when an etch-back treatment is undertaken, the interlayer insulating film is also removed by etching to expose the metallic wiring layer bare in the sparsely patterned areas. When the metallic wiring layer is exposed on the surface, shortcircuiting may eventually be caused between the wirings so that reliability of the electronic device is greatly decreased. Further, an ultrafine pattern of 0.35 µm line width or finer cannot be completely filled up resulting in the appearance of so-called "blowholes".

On the other hand, polysilazane solutions are known as a coating solution for the formation of a silica-based coating film. As compared with the coating solutions of a hydrolysis product of an alkoxy silane compound, the coating method using a polysilazane solution is highlighted in recent years because of the absence of the above described problems such as gas evolution, film thickness difference between densely and sparsely patterned areas, absence of "blowholes" and so on and possibility of obtaining a silica-based coating film having a large thickness, denseness and good adhesion to the substrate surface as well as excellent resistance against crack formation. Polysilazane solutions, however, are practically disadvantageous in handling because the solution is extremely unstable to cause early gelation when exposed to atmospheric air.

Several improvements have been proposed heretofore in the coating method by using a polysilazane solution including a method in which coating of the substrate surface with a polysilazane solution is followed by drying and a baking treatment is undertaken in an atmosphere of oxygen or water vapor as disclosed in Japanese Patent Kokai 5-121572, a method in which curing of the coating film is effected by heating or ultraviolet irradiation as disclosed in Japanese Patent Kokai 5-105486 and 5-119307 and a method in which curing of the coating film is effected as disclosed in Japanese Patent Kokai 5-243223. A problem in these prior art methods, however, is that some of the Si-N linkages and Si-H linkages remain undecomposed in the coating film after curing unavoidably to decrease the denseness and uniformity of the coating film. The method of the baking treatment in an atmosphere of water vapor has another problem that diffusion of the water molecules occurs to the interlayer insulating film formed on the metallic wiring layer to cause corrosion of the metallic wiring layer resulting in a decrease in the reliability of the semiconductor device as the final product.

SUMMARY OF THE INVENTION

The present invention accordingly has an object to provide an improved method for the formation, on the surface of a substrate, of a silica-based coating film having a sufficiently large thickness and capable of exhibiting excellent resistance against crack formation, uniformity, denseness and adhesion to the substrate surface and suitable for use as an interlayer insulating film, planarizing film, intermediate film, phase-shifter material, protective film and orientation film in the manufacture of semiconductor devices, liquid crystal display devices and the like in which fineness of patterning is essential.

Thus, the method of the present invention for the formation of a silica-based coating film on the surface of a substrate comprises the steps of:

(a) coating the surface of the substrate with a coating solution containing a polysilazane having a weight-average molecular weight in the range from 1000 to 5000 as dissolved in an organic solvent to form a coating layer;

(b) drying the coating layer by heating according to a schedule comprising a stage of heating within a range of temperature from 80° C. to 140° C. for a length of time from 2 minutes to 5 minutes followed by a continuous or stepwise increase of the temperature to reach 240° C. taking 2 minutes to 5 minutes and a stage of heating within a range of temperature from 240° C. to 350° C. for a length of time from 2 minutes to 5 minutes;

(c) irradiating the thus dried coating layer at a temperature in the range from 240° C. to 350° C. with ultraviolet light for 0.5 minute to 3 minutes; and (d) subjecting the coating layer after the ultraviolet irradiation to a baking treatment for 15 minutes to 90 minutes.

BRIEF DESCRIPTION OF THE DRAWING

The FIGURE shows the FT-IR spectra of the silica-based coating films obtained in the Example and Comparative Examples 1 to 3.

DETAILED DESCRIPTION OF THE PREFERRED EMBODIMENTS

As is described above, the inventive method for the formation of a silica-based coating film is characterized by the specific schedule for the temperature elevation for drying of the coating layer of a solution of a polysilazane having a specified weight-average molecular weight on the substrate surface followed by the ultraviolet irradiation at an elevated temperature and baking treatment to complete conversion of the polysilazane into silica.

As to the substrate on which a silica-based coating film is formed, the method of the present invention is applicable to any kinds of substrate materials without particular limitations including those in the manufacture of semiconductor devices and liquid crystal display devices. For example, the substrate material is a semiconductor silicon wafer provided with a circuit wiring layer of a metal such as aluminum when the silica-based coating film is used as an interlayer insulating film of a semiconductor device. The substrate is a semiconductor silicon wafer provided successively with a metallic circuit wiring layer and an interlayer insulating film when it is used as a planarizing film. The substrate is a semiconductor silicon wafer provided with an underlying resist layer when it is used as an intermediate film in a multilayered resist. The substrate is a glass plate provided with a layer of chromium when it is used as a material of a phase shifter. The substrate is a glass plate provided with a transparent electroconductive film such as indium tin oxide and the like when it is used as a protective film or an orientation film in a liquid crystal display device.

The coating solution applied to the surface of a substrate is prepared by dissolving a polysilazane having a weight-average molecular weight in the range from 1000 to 5000 or, preferably, from 1700 to 2500 in an organic solvent. When the weight-average molecular weight of the polysilazane is smaller than 1000, cyclic molecules of the polysilazane are formed in the coating solution so that no good coating film can be obtained. When the weight-average molecular weight thereof is larger than 5000, stability of the coating solution is decreased to cause premature gelation upon exposure to the atmospheric air so that a difficulty is encountered in handling thereof while the coating solution can be stable without gelation even by exposure to the atmospheric air for 90 days or longer when the polysilazane has an appropriate weight-average molecular weight.

The organic solvent used in the preparation of the coating solution is not particularly limitative and can be selected from those capable of dissolving the polysilazane and having appropriate vaporizability in the temperature range for drying of the coating layer. Examples of suitable organic solvents include aromatic hydrocarbon solvents such as benzene, toluene, xylene, ethyl benzene and the like, aliphatic hydrocarbon solvents, alcohols, esters, ketones and so on. These organic solvents can be used either singly or as a mixture of two kinds or more according to need. The concentration of the polysilazane in the coating solution should be in the range from 10 to 50% by weight or, preferably, from 20 to 40% by weight in consideration of easiness in handling and good film-forming behavior of the solution.

The coating method by which the coating solution is applied to the substrate surface in step (a) of the inventive method is not particularly limitative including various known methods such as spray coating, spin coating, dip coating, roll coating and the like.

In step (b) of the inventive method, the coating layer formed on the substrate surface is subjected to drying under a specified schedule for the temperature elevation. Namely, the temperature for drying is increased stepwise or continuously according to a schedule comprising a stage of heating at a temperature in the range from 80° to 140° C. for a length of time from 2 to 5 minutes followed by a continuous or stepwise increase of the temperature to reach 240° C. taking 2 to 5 minutes and a stage of heating at a temperature in the range from 240° to 350° C. for a length of time from 2 to 5 minutes. When the duration of the heating stages is too long or the rate of temperature elevation is too low as compared with the above defined schedule, a decrease is caused in the productivity of the process although no adverse effects are caused in the quality of the dried coating layer such as a roughened surface. When the rate of temperature elevation is too high, on the other hand, the dried coating layer may suffer from toughening of the surface.

In step (c) of the inventive method, the dried coating layer is subjected to irradiation with ultraviolet light while it is still at the finally reached drying temperature in the range from 240° to 350° C. The wavelength of the ultraviolet light is in the range from 100 to 400 nm or, preferably, from 180 to 260 nm and the irradiation treatment therewith is performed for from 0.5 to 3 minutes or, preferably, from 1 to 2 minutes. It is essential in the inventive method that the ultraviolet irradiation treatment of the coating layer is performed at a temperature in the range from 240° to 350° C. The coating layer of the polysilazane is converted into a silica-based coating film by the reaction with ozone generated by the ultraviolet irradiation.

In step (d) of the inventive method, the coating layer after the ultraviolet irradiation is subjected to a baking treatment in a baking furnace at a temperature in the range from 350° to 800° C. for a length of time in the range from 15 to 90 minutes to complete conversion of the polysilazane into silica. When a wiring layer of a metal such as aluminum is provided between the substrate surface and the coating film of the polysilazane, the baking temperature should be in the range from 350° to 450° C. in consideration of the low heat resistance of the metal while the baking temperature can be high enough in the range from 450° to 800° C. when such a metallic wiring layer is not provided.

When the polysilazane in the coating layer is subjected to the series of the treatments including drying, ultraviolet irradiation and baking each under the above specified conditions, the linkages of Si-N, Si-H and N-H in the polysilazane disappear and Si-O linkages are formed in the coating layer to give a very dense silica-based coating film. This fact can be confirmed from the FT-IR spectrum of the coating film shown in the accompanying drawing.

The silica-based coating film obtained by the inventive method has a chemical structure consisting of Si-O linkages and has a thickness, usually, in the range from 0.05 to 2 μm or, in most cases, from 0.1 to 1 μm depending on the particularly intended application of the film and has excellent resistance against crack formation, denseness, uniformity and adhesion to the substrate surface.

The silica-based coating film obtained according to the inventive method is useful in the manufacture of semiconductor devices as an interlayer insulating film on the wiring layer of a metal such as aluminum formed on a silicon wafer, as a planarizing layer on the interlayer insulating film formed by the plasma CVD method on the metallic wiring layer, as an intermediate film formed between the undercoating and overcoating resist layers in a multilayered resist and as a material of phase shifter on the chromium layer formed on a glass substrate as well as in the manufacture of liquid crystal display devices as a protective film on the transparent electroconductive film such as ITO (indium-tin oxide) formed on a glass substrate and as an orientation film for improvement of the orientation of the liquid crystal.

In the following, the method of the present invention is described in more detail by way of an example and comparative examples, which, however, never limit the scope of the invention in any way.

EXAMPLE

A silicon wafer, on which a wiring pattern of aluminum was formed and further thereon a plasma TEOS (tetraethoxy silane) layer was formed, was coated with a xylene solution of a polysilazane having a weight-average molecular weight of 2500 in a concentration of 25% by weight on a spin coater rotating at 3000 rpm followed by drying on a hot plate at 120° C. for 3 minutes, then on a second hot plate at 170° C. for 3 minutes and finally on a third hot plate at 250° C. for 3 minutes to form a dried coating layer of the polysilazane.

In the next place, the dried polysilazane layer still kept at 250° C. was irradiated for 1 minute in air with far ultraviolet light in a wavelength region of 185 to 254 nm by using an ultraviolet irradiation machine (Deep UV Processor manufactured by Nippon Denchi Co.) followed by a baking treatment in air for 30 minutes in a baking furnace at 400° C. so as to convert the polysilazane film to a silica-based coating film.

This silica-based coating film had a thickness of 0.4 μm with excellent flatness of the surface. The coating film was dense and free from cracks and the adhesion to the substrate surface was good.

Curve I in the FIGURE of the accompanying drawing is an FT-IR spectrum of the silica-based coating film obtained in this manner, which indicates disappearance of the peak at 3375 cm$^{-1}$ assignable to the N-H linkages, peaks at 2250 cm$^{-1}$ and 929 cm$^{-1}$ assignable to the Si-H linkages and peak at 831 cm$^{-1}$ assignable to the Si-N linkages and appearance of the peak at 1100 cm$^{-1}$ assignable to the Si-O linkages.

COMPARATIVE EXAMPLE 1

The experimental procedure was substantially the same as in the Example described above excepting omission of the ultraviolet irradiation treatment. Curve II in the FIGURE of the accompanying drawing is an FT-IR spectrum of the thus formed silica-based coating film, which indicates remaining of the peak at 3375 cm$^{-1}$ assignable to the N-H linkages, peaks at 2250 cm$^{-1}$ and 929 cm$^{-1}$ assignable to the Si-H linkages and peak at 831 cm$^{-1}$ assignable to the Si-N linkages as a consequence of the incomplete conversion of the coating layer of polysilazane into a silica-based coating film.

COMPARATIVE EXAMPLE 2

The experimental procedure was substantially the same as in the Example described above except that the ultraviolet irradiation treatment was omitted and the baking treatment was conducted in an atmosphere of oxygen plasma in a baking furnace. Curve III in the figure of the accompanying drawing is an FT-IR spectrum of the thus formed silica-based coating film, which indicates, though with disappearance of the peak at 3375 cm$^{-1}$ assignable to the N-H linkages, remaining of the peaks at 2250 cm$^{-1}$ and 929 cm$^{-1}$ assignable to the Si-H linkages and peak at 831 cm$^{-1}$ assignable to the Si-N linkages as a consequence of the incomplete conversion of the coating layer of polysilazane into a silica-based coating film.

COMPARATIVE EXAMPLE 3

The experimental procedure was substantially the same as in the Example described above except that the ultraviolet irradiation treatment was omitted and the baking treatment was conducted in an atmosphere of a mixture of oxygen and water vapor introduced into a baking furnace at rates of 6 liters/minute and 3 g/minute, respectively. Curve IV in the figure of the accompanying drawing is an FT-IR spectrum of the thus formed silica-based coating film, which indicates, though with disappearance of the peak at 3375 cm$^{-1}$ assignable to the N-H linkages, remaining of the peaks at 2250 cm$^{-1}$ and 929 cm$^{-1}$ assignable to the Si-H linkages and peak at 831 cm$^{-1}$ assignable to the Si-N linkages as a consequence of the incomplete conversion of the coating layer of polysilazane into a silica-based coating film.

COMPARATIVE EXAMPLE 4

A silicon wafer was coated with the same polysilazane solution as used in the Example described above also in the same manner and the silicon wafer was mounted on a hot plate at 250° C. for 3 minutes to form a dried coating layer of the polysilazane.

As inspected with an optical microscope, the coating layer had a roughened surface with ruggedness so that no dense and uniform silica-based coating film could be obtained from this coating layer of polysilazane by the ultraviolet irradiation and baking treatments.

COMPARATIVE EXAMPLE 5

The experimental procedure was substantially the same as in the Example described above except that the coating layer on the substrate surface was subjected to the drying treatment by heating first on a hot plate at 100° C. for 3 minutes immediately followed by heating on another hot plate at 250° C. for 3 minutes.

As inspected with an optical microscope, the coating layer had a toughened surface with ruggedness so that no dense and uniform silica-based coating film could be obtained from this coating layer of polysilazane by the ultraviolet irradiation and baking treatments.

What is claimed is:

1. A method for the formation of a silica-based coating film on the surface of a substrate which comprises the steps of:

(a) coating a surface of a substrate with a coating solution containing a polysilazane having a weight-average molecular weight in the range from 1000 to 5000 as dissolved in an organic solvent to form a coating layer;

(b) drying the coating layer by heating according to a schedule comprising a stage of heating within a range of temperature from 80° C. to 140° C. for a length of time from 2 minutes to 5 minutes followed by a continuous or stepwise increase of the temperature to reach 240° C. taking 2 minutes to 5 minutes and a stage of heating within a range of temperature from 240° C. to 350° C. for a length of time from 2 minutes to 5 minutes;

(c) irradiating the thus dried coating layer at a temperature in the range from 240° C. to 350° C. with ultraviolet light; and (d) subjecting the coating layer after the ultraviolet irradiation to a baking treatment for 15 minutes to 90 minutes.

2. The method for the formation of a silica-based coating film on the surface of a substrate as claimed in claim 1 in which the polysilazane has a weight-average molecular weight in the range from 1700 to 2500.

3. The method for the formation of a silica-based coating film on the surface of a substrate as claimed in claim 1 in which the ultraviolet light has a wavelength in the range from 180 nm to 260 nm.

4. The method for the formation of a silica-based coating film on the surface of a substrate as claimed in claim 1 in which the temperature of the baking treatment in step (d) is in the range from 350° C. to 800° C.

5. The method for the formation of a silica-based coating film on the surface of a substrate as claimed in claim 1 in which the ultraviolet irradiation in step (c) is performed for a length of time in the range from 0.5 minute to 3 minutes.

6. The method for the formation of a silica-based coating film on the surface of a substrate as claimed in claim 1 in which the baking treatment in step (d) is performed in air.

* * * * *